(12) United States Patent
Werdecker et al.

(10) Patent No.: US 6,672,107 B2
(45) Date of Patent: Jan. 6, 2004

(54) QUARTZ GLASS CRUCIBLE AND PROCESS FOR THE PRODUCTION THEREOF

(75) Inventors: Waltraud Werdecker, Hanau (DE); Johann Leist, Altenstadt (DE)

(73) Assignee: Heraeus Quarzglas GmbH & Co. KG, Hanau (DE)

( * ) Notice: Subject to any disclaimer, the term of this patent is extended or adjusted under 35 U.S.C. 154(b) by 40 days.

(21) Appl. No.: 09/913,632

(22) PCT Filed: Dec. 14, 2000

(86) PCT No.: PCT/EP00/12686
§ 371 (c)(1),
(2), (4) Date: Aug. 16, 2001

(87) PCT Pub. No.: WO01/46077
PCT Pub. Date: Jun. 28, 2001

(65) Prior Publication Data
US 2003/0041623 A1 Mar. 6, 2003

(30) Foreign Application Priority Data
Dec. 22, 1999 (DE) .......................... 199 62 449

(51) Int. Cl.$^7$ .............................. C03B 19/06
(52) U.S. Cl. .................. 65/17.4; 65/17.3; 65/32.1; 65/134.9; 65/136.1; 65/135.6; 65/144; 65/157; 65/302; 65/356; 65/DIG. 4
(58) Field of Search ................. 65/17.3, 17.4, 65/32.1, 134.9, 136.1, 135.6, 144, 157, 302, DIG. 4, 356

(56) References Cited

U.S. PATENT DOCUMENTS 4,632,686 A * 12/1986 Brown et al.
5,174,801 A * 12/1992 Matsumura et al.
5,772,714 A * 6/1998 Sato et al.

FOREIGN PATENT DOCUMENTS

| DE | 44 40 104 A | 5/1995 |
| DE | 197 10 672 A | 11/1997 |
| EP | 0 319 031 A | 6/1989 |
| EP | 0 463 543 A | 1/1992 |

OTHER PUBLICATIONS

Patent Abstracts of Japan, vol. 16, No. 470, Sep. 30, 1992.

* cited by examiner

Primary Examiner—Michael Colaianni
(74) Attorney, Agent, or Firm—Tiajoloff & Kelly; Andrew L. Tiajloff

(57) ABSTRACT

In order to provide a quartz glass crucible distinguished by high purity, high opacity and/or low transmissibility in the IR spectrum, it is proposed on the basis of a known quartz glass crucible of opaque quartz glass with a crucible body symmetrical in relation to a rotational axis, an outer zone (3) of opaque quartz glass transitioning radially toward the inside into an inner zone (2) of transparent quartz glass and with a density of at least 2.15 g/cm$^3$, that according to the invention, the crucible body (1) be made of a synthetic SiO$_2$ granulate with a specific BET surface ranging from 0.5 m$^2$/g to 40 m$^2$/g, a tamped volume of at least 0.8 g/cm$^3$ and produced from at least partially porous agglomerates of SiO$_2$ primary particles. A process for producing a quartz glass crucible of this kind is distinguished according to the invention in that for the production of the crucible a SiO$_2$ granulate is used which was formed from at least partially porous agglomerates of synthetically manufactured SiO$_2$ primary particles and that it has a specific BET surface ranging from 0.5 m$^2$/g to 40 m$^2$/g and a tamped volume of at least 0.8 g/cm$^3$, the heating effected in such a way that a vitrification front advances from the inside outward while an inner zone (4) of transparent quartz glass is being formed.

28 Claims, 2 Drawing Sheets

QUARTZ GLASS CRUCIBLE AND PROCESS FOR THE PRODUCTION THEREOF

Figure 1:
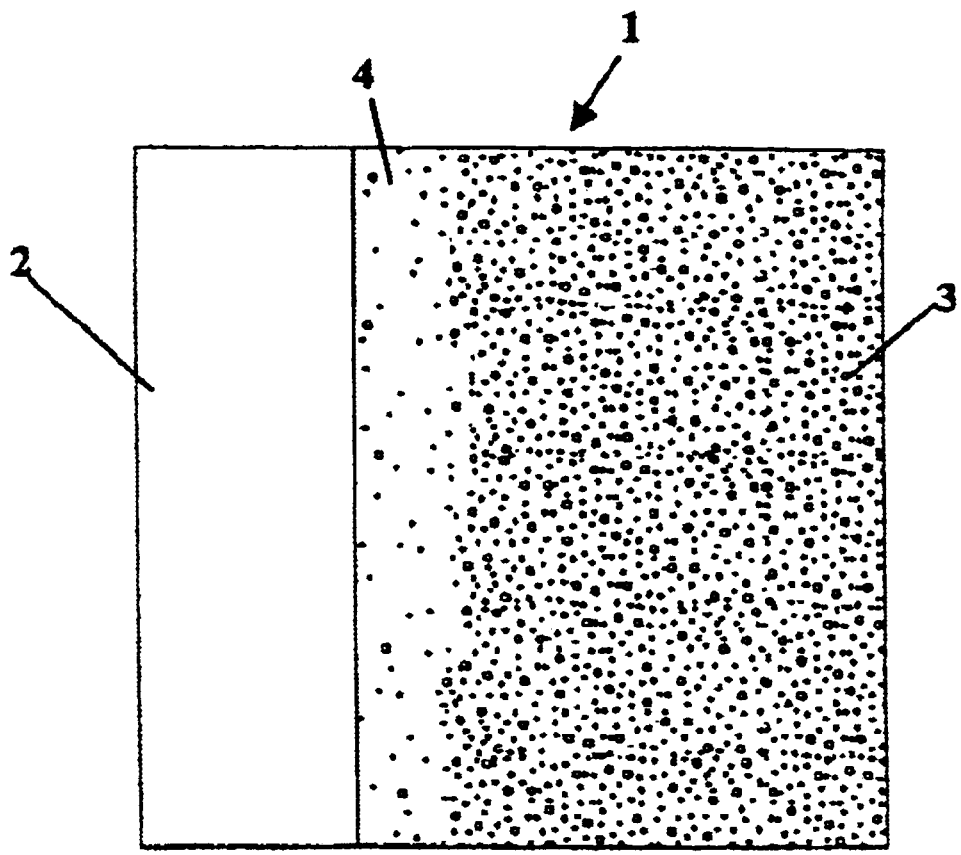

The invention concerns a quartz glass crucible having a crucible body of opaque quartz glass which is symmetrical relative to its rotational axis and has an outer zone of opaque quartz glass which transitions toward the inside into an inner zone of transparent quartz glass with a density of at least 2.15 g/cm$^3$.

Furthermore, the invention concerns a process for the production of a quartz glass crucible by providing a mold rotatable about a rotational axis and having an inner wall, adding $SiO_2$ granulate into the mold to form a granulate layer on the inner wall of the mold, and heating the granulate layer from the inside toward the outside while rotating the mold and forming a vitrified crucible body with an opaque outer zone.

A quartz glass crucible of this kind is described in DE A1 4,440,104. The known quartz glass crucible comprises a crucible base body with an opaque outer zone which transitions toward the inside into a smooth, wear resistant, dense inner zone. The thickness of the inner zone is between 1 and 2 mm and the density is at least 2.15 g/cm$^3$. The quartz glass crucible is produced in a slip casting process. The quartz glass is reduced to a powdered material having a particle size of less than 70 μm while water is being added The resulting slip is poured into a negative plaster mold for the crucible and the crucible blank obtained after drying is sintered at a temperature between 1350° C. and 1450° C. After the sintering, selected surface zones of the opaque and porous crucible blank are subjected to further heat treatment at between 1650° C. and 2200° C. in order to transform the opaque and porous base material into transparent quartz glass with a density of at least 2.15 g/cm$^3$. As a result, the crucible base body obtains the above-said opaque outer zone which transitions toward the center into the smooth, wear resistant and dense inner zone.

A process of the kind mentioned above is known from DE C1 9,710,672, which describes the production of a quartz glass crucible for the pulling of a silicon monocrystal according to the Czochralski method, by means of the so-called pouring-in process. In the said process, a granulate layer of natural quartz glass granulate is formed at first on the inner wall of a rotating smelting mold and is vitrified, forming an opaque base body. Thereupon, in order to create a transparent, smooth, inner layer, synthetic quartz glass powder is poured in and deposits on the inner wall of the base body where it is melted into a dense, transparent inner layer by means of an electric arc. The quartz glass crucible produced in this manner consists of an opaque base body and a transparent, dense inner layer that forms the inner surface of the quartz glass crucible. The starting material of the inner layer differs from that of the base body. The inner layer is produced in a separate process step and primarily serves to prevent migration of impurities from the base body to the inner surface.

Due to its impurity content, the quartz glass crucible described initially is unsuitable for applications requiring high purity. The production of the transparent inner zone requires costly additional heat treatment. The opaque outer zone substantially blocks light in the visible spectrum, but is largely transparent in the infrared (hereinafter referred to as IR) spectrum. Radiation loss in the IR spectrum causes a considerable temperature gradients across the wall of the crucible. However, compensating for the radiation loss by raising the temperature of the melt inside the crucible can lead to softening, deformation and sagging of the crucible wall, which can result in reduced service life. This problem is most noticeable in large crucibles which are generally used for longer periods than smaller ones.

The aforementioned process for the manufacture of a quartz glass crucible using the pouring-in method also requires an additional process step for the manufacture of the inner layer and it too is therefore costly.

The object of the invention is to provide a quartz glass crucible distinguished by high purity and high opacity, i.e., low transmission in the IR spectrum, and a simple, cost efficient process for the production thereof.

The object to provide a quartz glass crucible is achieved on the basis of the crucible mentioned initially in that the crucible body is produced from synthetic $SiO_2$ granulate having a specific BET density ranging from 0.5 m$^2$/g to 40 m$^2$/g, a tamped volume of at least 0.8 g/cm$^3$, and formed from at least partially porous agglomerates of primary $SiO_2$ particles.

The quartz glass crucible according to the invention is composed entirely of synthetically produced $SiO_2$. Due to this highly pure starting material the quartz glass crucible is distinguished by high purity throughout. No measures are required to prevent migration of impurities from the quartz glass crucible into the melt contained therein.

The crucible body comprises an outer zone of opaque quartz glass and an inner zone of transparent quartz glass. The outer and inner zones are integrally joined regions. This means that there is no precise, defined boundary area.

The quartz glass crucible according to the invention is produced from synthetic $SiO_2$ granulate. An opaque outer zone and a transparent inner zone are obtained by vitrification of the appropriate granulate fill. During the vitrification process the vitrification front advances from the interior outward. Open pores and pore channels are closed during the process and gases are displaced in the direction of the inner wall of the form. Due to the greater effect of the temperature in the inner zone region (higher temperature and longer heating period) the inner zone is free of pores, or has very few pores, so that its density is at least 2.15 g/cm$^3$. This density is nearly that of transparent quartz glass. Therefore the mechanical and chemical properties of the inner zone correspond to those of dense transparent quartz glass with respect to mechanical strength, hardness and chemical stability.

The outer zone is distinguished by high opacity in the IR spectrum. Opacity in the sense of the invention is low transparency (less than 1%) both in the visible (between about 350 nm and 800 nm) and in the IR spectra. In the IR spectrum, between 750 nm and 4800 nm, the transmissibility in a 3 mm thick disk is less than 1%. The high opacity in the IR spectrum is substantially achieved in that the outer zone is produced from $SiO_2$ granulate formed from partially porous agglomerates of primary $SiO_2$ particles and has a specific BET surface between 0.5 m$^2$/g and 40 m$^2$/g. Vitrification of such $SiO_2$ granulate results in opaque quartz glass with a homogenous pore distribution as well as with high pore density and high specific density. By contrast, opaque quartz glass produced from natural or synthetic quartz glass granulate with a low specific surface has, first of all, large bubbles and the bubble distribution density is relatively lower. This causes primarily opacity in the visible spectrum. When used as intended, the quartz glass crucible according to the invention reduces the temperature gradient across the crucible wall due to high opacity in the IR spectrum so that no compensation is required such as, for example, by the overheating of the melt or by the installation of a thermal screen (heat shield). A quartz glass crucible obtained by the vitrification of this type of granulate is therefore distinguished by good heat insulation and long service life.

The fineness of the pores in the outer zone required therefor is achieved by using a $SiO_2$ granulate which is present in form of at least partially porous agglomerates of primary $SiO_2$ particles. Such primary particles are obtained by, for example, flame hydrolysis or oxidation of silicon compounds, by hydrolysis of organic silicon compounds using the so-called sol-gel process, or by hydrolysis of inorganic silicon compounds in a fluid. Even though such primary particles are generally distinguished by high purity, they are difficult to handle due to their low bulk density. Compacting by means of a granulating process is used therefor. During granulation, agglomerates with larger diameters are formed by an agglomeration of the small primary particles. These agglomerates have a plurality of open pore channels that form a correspondingly large pore volume. The individual grains of the $SiO_2$ granulate employed are formed from such agglomerates. Due to the large pore volume the granulate is distinguished by a specific BET surface area ranging from 0.5 $m^2/g$ to 40 $m^2/g$. The surface is therefore not present as the outer surface but mostly as inner surface in form of pore channels. During vitrification, the larger proportion of the pore volume is closed due to sintering and collapsing. However, the greater part of the previously open pore channels remains as a plurality of small closed pores which reflect IR radiation, leading to the high opacity in the IR spectrum. Furthermore, the large surface area of the granulate helps to create gaseous silicon oxide (SiO) during vitrification, which counteracts the collapsing of small pores since the gases trapped in the small closed pores can no longer escape. In addition, the great specific surface area allows an especially effective purification, for example by means of thermal chlorination, before the granulate is put to use. Impurities are, after all, found primarily in the free surface region where they are easily dissolved are removed via the open pore channels.

The tamped volume of at least 0.8 $g/cm^3$ in the first place assures pourability of the $SiO_2$ granulate, while the opacity of the quartz glass is substantially—as discussed above—caused by the large specific surface present as inner surface.

The specific surface of the $SiO_2$ granulate is determined by the BET process (DIN 66132) and the tamped volume by DIN/ISO 787/11.

In a preferred embodiment the crucible body according to the invention is produced from synthetic $SiO_2$ granulate with a specific BET surface ranging from 2 $m^2/g$ to 20 $m^2/g$ and with a tamped volume ranging from 1.0 $g/cm^3$ to 1.4 $g/cm^3$.

Advantageously, the quartz glass has a metastable OH content of max. 20 ppm by weight in the region of the inner zone. In general, "metastable OH content" means that hydroxyl group content which is removable by means of a heat treatment of the quartz glass. In the context of this invention, a "metastable OH content" is defined as a hydroxyl content which is removable by heating the quartz glass to a temperature of 1,000° C. over a period of 40 hours in a vacuum of $10^{-1}$ mbar. Those OH groups that are not removable by this heat treatment will be hereinafter referred to as "firmly bound hydroxyl groups." An inner zone with a metastable OH content of max. 20 ppm by weight will assure that none, or few, hydroxyl groups are released when the quartz glass crucible is used as intended. In addition, due to the low content of metastable hydroxyl groups, the risk of pore enlargement or bubble formation during use of the quartz glass crucible is reduced. These effects can appear when gases are released during the heating of the quartz glass, and cannot escape.

Chemically firmly bound hydroxyl groups do not result in pore enlargement during the use of the quartz glass crucible. Preferably however, the content of firmly bound hydroxyl groups is at max. 40 ppm by weight. Quartz glass with a lower OH content has greater viscosity than quartz glass with a higher OH content. Higher viscosity improves form stability of the quartz glass crucible at high temperatures. Since firmly bound hydroxyl groups can be also partially removed at high temperatures in a vacuum, a lower content of such hydroxyl groups reduces the danger of pore enlargement with use of the quartz glass crucible in vacuum.

The opaque outer zone and the transparent inner zone are produced from the same synthetic $SiO_2$ granulate. A crucible of this kind is particularly easy to manufacture.

In an alternative and equally preferred embodiment of the quartz glass crucible according to the invention the opaque outer zone is made from a first $SiO_2$ granulate having lower density, and the inner zone from a second $SiO_2$ granulate having higher density. A precompacting of the second granulate facilitates the adjustment of the required density in the inner zone.

The preferred embodiment of the quartz glass crucible according to the invention is one where the inner zone is produced from a $SiO_2$ granulate which is at least partially composed of synthetic cristobalite. Before use, the $SiO_2$ granulate is partially converted to synthetic cristobalite by tempering. It has been shown that converting to cristobalite also results in reduction of the OH content. The inner zone made of $SiO_2$ granulate obtained from synthetic cristobalite is therefore distinguished by a low OH content.

The inner zone preferably extends up to 2 mm from the inner surface in the direction of the outer zone.

It has been shown to be advantageous to provide the transparent inner zone with an inner layer of transparent quartz glass. The inner layer primarily serves to reinforce the particular inner zone.

As far as concerns the process, the object described above is achieved according to the invention on the basis of the known process described at the onset in that the $SiO_2$ granulate used is formed from at least partially porous agglomerates of synthetically produced primary $SiO_2$ particles and has a specific surface BET area ranging from 0.5 $m^2/g$ to 40 $m^2/g$ and a tamped volume of at least 0.8 $g/cm^3$. The heating is effected such that a vitrification front advances from the inside toward the outside while forming an inner zone of transparent quartz glass.

The granulate layer is vitrified during the heating. During this process an opaque outer zone and a transparent inner zone are obtained in one processing step. The vitrification front advances from the inside toward the outside during the vitrification process. Open pores and pore channels in the granulate are closed hereby and gases are displaced in the direction of the inner wall of the form. Due to the greater thermal effect in the region of the inner zone (higher temperature and longer heating period) the said zone becomes free of pores or has very few pores so that its density is least 2.15 $g/cm^3$.

The vitrification front is an indistinct boundary region between material that is melted and material that is partially melted. The latter presents open pores and channels while the former has closed pores that are no longer connected with the outer surface. Because the vitrification front advances from the inside to the outside, sublimatable impurities are transformed into the gas phase and driven before the vitrification front toward the outside in the direction of regions of the granulate layer which are still porous and where they can escape.

Since the transparent inner zone is obtained during the vitrification of the granulate layer, no additional vitrification step is required. The process according to the invention is therefore simple and cost effective. Mechanical stresses that typically appear during localized heating are avoided.

The process according to the invention produces an outer zone having high opacity, or low transmissibility, in the IR spectrum. The direct spectral permeability of a 3 mm thick disk is less than 1% in the wavelength region between 600 nm and 2650 nm. This is substantially achieved in that the outer zone is made of a $SiO_2$ granulate which is formed from partially porous agglomerates of primary $SiO_2$ particles and has a specific BET surface area ranging from $0.5\ m^2/g$ to $40\ m^2/g$. The vitrification of such $SiO_2$ granulate provides an opaque quartz glass with a homogenous pore distribution while at the same time presenting high pore density and high specific density. By contrast, when natural or synthetic quartz glass granulates with low specific surface area are used (for example below the measurable limit) the result is a presence of large bubbles and a low bubble density which primarily leads to opacity in the visible spectrum. Quartz glass crucibles produced with use of the above-mentioned granulate are distinguished by good thermal insulation due to high opacity in the IR spectrum.

The fineness of the pores in the outer zone required therefor is achieved by using a $SiO_2$ granulate which is present in form of at least partially porous agglomerates of primary $SiO_2$ particles. Such primary particles are obtained by for example flame hydrolysis or oxidation of silicon compounds, by hydrolysis of organic silicon compounds using the so-called sol-gel process, or by hydrolysis of inorganic silicon compounds in a fluid. Such primary particles are handled only with great difficulty due to their low bulk density. Compacting by means of a granulating process is used for handling. During granulation, agglomerates with larger diameters are formed by an agglomeration of the small primary particles. These agglomerates have a plurality of open pore channels that form a correspondingly large pore volume. The individual grains of the $SiO_2$ granulate employed are formed from such agglomerates. Due to the large pore volume, the granulate is distinguished by a specific BET surface area ranging from $0.5\ m^2/g$ to $40\ m^2/g$. The surface area is therefore present not as the outer surface but mostly as internal surface in form of pore channels. During vitrification, the larger proportion of the pore volume is closed due to sintering and collapsing. However, the greater part of the previously open pore channels remains as a plurality of small closed pores which reflect IR radiation, leading to the high opacity in the IR spectrum. Furthermore, the large surface area of the granulate helps to create gaseous silicon oxide (SiO) during vitrification, which counteracts the collapsing of small pores since the gases trapped in the small closed pores can no longer escape. In addition, the large specific surface area permits an especially effective purification, for example by means of thermal chlorination, before the granulate is put to use. Impurities are, after all, found primarily in the free surface region from which they are easily removed and carried away via the open pore channels.

The tamped volume of at least $0.8\ g/cm^3$ primarily assures pourability of the $SiO_2$ granulate, while the opacity of the quartz glass is substantially assured—as discussed above—by the great specific surface which is formed as internal surface.

The specific surface of the $SiO_2$ granulate is determined by the BET process (DIN 66132) and the tamped volume by DIN/ISO 787/11.

In a preferred method of proceeding, use is made of synthetic $SiO_2$ granulate with a specific BET surface ranging from $2\ m^2/g$ to $20\ m^2/g$ and with a tamped volume ranging from $1.0\ g/cm^3$ to $1.4\ g/cm^3$. Such tamped volume has been shown to be particularly well suited with respect to pourability and ease of handling.

In a preferred variant of the process, use is made of a $SiO_2$ granulate in form of at least partially porous agglomerates of primary $SiO_2$ particles with an average size of less than 5 µm. Such primary particles are obtained in the so-called sol-gel process by the hydrolysis of organic silicon compounds. In an alternative and equally preferred variant of the process, use is made of a $SiO_2$ granulate in form of at least partially porous agglomerates of primary $SiO_2$ particles with an average particle size of less than 0.2 µm. Such pyrogenic primary particles are formed by flame hydrolysis or oxidation of inorganic silicon compounds. The primary particles are preferably amorphous due to a low devitrification tendency during vitrification.

In both variants of the process, the primary particles are distinguished by a large free surface. Agglomeration of a plurality of such particles due to physical or chemical binding forces forms granulates in the sense of the invention. Known granulation processes are employed, in particular build-up granulation (wet granulation process) or extrusion of a mass containing the primary particles. Especially the primary particles gained by way of the sol-gel process are densely packed in the granulate since they are largely and preferably spherical. The free surface is reduced by the contact surfaces of adjoining particles; however, closed pores may develop between the individual primary particles during vitrification, as discussed above. Due to the fact that the primary particles have an average particle size of less than 5 µm, the resulting pore distribution is correspondingly fine. The average particle size is determined according to ASTM C1070 and is described as the so-called $D_{50}$ value.

An especially suitable granulate for use in the process according to the invention has been shown to be one of $SiO_2$ particles having nonhomogenous density distribution and with an inner region of lesser density being at least partially enclosed by an outer region of greater density. The individual granules of the granulate are called $SiO_2$ particles here and hereinafter, while the totality of the particles is called the granulate. The nonhomogenous density distribution makes it possible to trap gases in the inner region where they cannot escape or can only partially escape during the vitrification, thus contributing to pore formation and opacity of the quartz glass. This density distribution is for example also achieved if the inner region comprises a hollow space.

The specific surface and the tamped volume of the $SiO_2$ granulate is particularly easily adjusted by thermal treatment which comprises sintering at temperatures ranging from 800° C. to 1,450° C. Higher densities are also achievable in the outer region, for example by maintaining a temperature gradient during the thermal treatment. When a temperature gradient is established, the pores and pore channels shrink preferably in the surface-near regions of the individual particles, i.e. in the outer region. The latter thus develops a density that is higher than that of the porous or hollow interior region. The thermal treatment of the $SiO_2$ granules is stopped or interrupted before the initially established temperature gradient between the outer region and the inner region is equalized. This is easily accomplished by for example passing the granulate in a continuous run through a heating zone. Such a temperature gradient is easier to establish with larger granules than with smaller granules as will be explained in more detail below.

A method of proceeding has been shown to be of advantage wherein the thermal treatment comprises heating in a chlorine-containing atmosphere. Treatment in chlorine containing atmosphere removes impurities that form volatile chlorine compounds at the treatment temperature, and OH groups. This improves the purity of the opaque quartz glass, raises the viscosity and the devitrification tendency is further reduced. The chlorine containing atmosphere contains chlorine and/or chlorine compounds. In a pure quartz glass in the sense of the invention the contamination by Li, Na, K, Mg, Ca, Fe, Cu, Cr, Mn, Ti, and Zr totals less than 250 ppb by weight. Dopants are not considered to be impurities in this context.

In a preferred method of proceeding, the thermal treatment comprises heating of the porous agglomerates at between 1,000° C. and 1,300° C. in a nitrogen containing atmosphere and in the presence of carbon. The entire free surface of granules obtained by means of this variant is nitrogen enriched. The addition of nitrogen is facilitated by the presence of carbon which volatilizes. It has been shown that addition of nitrogen raises the viscosity of the quartz glass.

A high viscosity is also achieved with a granulate which consists of $SiO_2$ granules doped with between 5 ppm by weight and 20 ppm by weight of aluminum. The doping is accomplished by finely distributed nanoscale $Al_2O_3$ particles. This assures a homogenous distribution of the dopant. Due to the use of the granulate described above, composed of nanoscale particles, the dopant is also evenly distributed within the individual granules. This is not possible when conventional $SiO_2$ granulates are used. That is so because the added dopants are only able to settle on the granule surface so that after vitrification they are concentrated in the region of the previous granule boundary. Pyrogenically manufactured $Al_2O_3$ particles are particularly well suited due to their large specific surface.

It has been shown to be advantageous to avoid small granule content of particles under 90 $\mu$m when a $SiO_2$ granulate with an average granule size between 150 $\mu$m and 800 $\mu$m is used. For this purpose, granules sized under 90 $\mu$m are removed from the granulate or their formation is prevented already in the production of the granulate. In a larger granule, a temperature gradient develops during the vitrification of the preform or during thermal treatment for the precompacting of the granulate, which leads to a density gradient within the granule and greater compacting in the outer region and thus favors pore formation during vitrification, as discussed above. The small size of finer granules, on the other hand, makes formation of such density gradients more difficult or prevents it so that the small particle content does not contribute to pore formation. Furthermore, the small particle content affects shrinkage of the quartz glass during collapsing of the pore channels and makes it more difficult to maintain predetermined dimensions.

Advantageously, formations of the outer zone and the inner zone takes place through zone by zone heating of the granulate layer using an electric arc, with the temperature in the inner zone region reaching 1900° C. Thus the production of the inner and outer zones can take place cost effectively in one common step.

It has been shown to be of advantage to bring the granulate layer to a temperature of 1000° C. before the heating. The preheating takes place below the melting temperature of the granulate and effects an even heating throughout the thickness of the granulate. It can be of advantage here if the $SiO_2$ granulate is already being partially vitrified in the inner zone region. This is facilitates the development of the required density during the subsequent heating stage.

The opaque outer zone is preferably produced from a first $SiO_2$ granulate of lesser density, and the transparent inner zone from a second $SiO_2$ granulate of higher density. The precompacting of the second granulate facilitates the development of the required density in the inner zone region.

Advantageously, in the inner zone use is made of a $SiO_2$ granulate which has been at least partially transformed into synthetic cristobalite by means of tempering. It has been shown that transformation into cristobalite also brings about reduction of the OH content. Therefore, the inner zone produced from $SiO_2$ granulate containing synthetic crystallite is distinguished by a low OH content.

In this respect it has also been shown to be advantageous if the second $SiO_2$ granulate used for the production of the inner zone is subjected to dehydration prior to use to bring the OH content to max. 40 ppm by weight and if the granulate dehydrated in this manner is subsequently vitrified.

Advantageously, the second $SiO_2$ granulate has a metastable OH content of max. 20 ppm by weight. Regarding the terms "metastable OH content" and "firmly bound hydroxyl groups" reference is made to the aforementioned definition. An inner zone with a metastable OH content of max. 20 ppm by weight will assure that none or few hydroxyl groups are released during use of the quartz glass crucible as intended. In addition, due to the low content of metastable hydroxyl groups, the risk of pore enlargement and a bubble formation during use of the quartz glass crucible is reduced. These effects can appear when gases are released during heating of the quartz glass and cannot escape.

It is true that chemically firmly bound hydroxyl groups do not result in pore enlargement during use of the quartz glass crucible. Preferably however, the content of firmly bound hydroxyl groups is at max. 40 ppm by weight. Quartz glass with a lower OH content has greater viscosity than quartz glass with a higher OH content. Higher viscosity improves form stability of the quartz glass crucible at high temperatures. Since firmly bound hydroxyl groups can also be partially removed at high temperatures in a vacuum, a lower content of such hydroxyl groups reduces the danger of pore enlargement during the use of the quartz glass crucible in a vacuum.

In a particularly preferred method of proceeding, an inner layer of transparent quartz glass in produced on the transparent inner zone by pouring $SiO_2$ granulate into the rotating mold where it settles on the inner zone and is vitrified by an electric arc. The inner layer of transparent quartz glass primarily serves to reinforce the inner zone.

A further improvement results when a vacuum is generated in the inner wall region during the heating of the granulate layer. Excess gases are removed quickly due to the vacuum and the melting time is shortened.

The invention will be explained in more detail below by way of exemplary embodiments and a drawing. The drawing schematically shows in FIG. 1, an embodiment of the quartz glass crucible according to the invention in a cross section of the crucible wall, in FIG. 2, a first embodiment of a $SiO_2$ granulate suitable for use in the process according to the invention, by way of a cross section of an individual granule, and in FIG. 3, a further embodiment of a $SiO_2$ granulate suitable for use in the process according to the invention, by way of a cross section of an individual granule.

FIG. 1 schematically shows a cross section of the wall of a quartz glass crucible according to the invention.

The quartz glass crucible consists entirely of synthetically produced $SiO_2$. It has a base body, overall designated by the numeral 1, and an inner layer 2 of quartz glass granulate. The base body 1 comprises two regions that differ only in respect to their opacity, or transmissibility, i.e., a opaque outer region 3 and a transparent region 4. The base body has an overall wall thickness of about 5 mm. Of that, the opaque outer region 3 measures about 4 mm and the transparent region 4 about 1 mm. The outer region 3 and the transparent region 4 are integrally joined so that there is no precise, defined boundary surface.

The quartz glass crucible is manufactured from synthetic $SiO_2$ as explained in more detail below by way of examples.

The transparent region 4 is free of pores, or low on pores, to the extent that it has a density of at least 2.15 g/cm$^3$. This density is nearly that of transparent quartz glass. Therefore, its mechanical and chemical properties correspond to those of dense transparent quartz glass, such as for example with respect to mechanical strength and hardness, and chemical stability.

By contrast, the outer region 3 is distinguished by high opacity, or low transmissibility, in the IR spectrum. The transmissibility of a 3 mm thick disk is less than 1% in the wavelength range between 750 nm and 4800 nm. The low transmissibility is achieved by small pore size with homogenous pore distribution, in conjunction with high pore density and high specific density. The pore size in the opaque outer region is predominantly between 5 µm and 40 µm. The quartz glass crucible is therefore distinguished by good heat insulation and a long service life.

The process according to the invention for the manufacture of a quartz glass crucible according to the invention is described in more detail below by way of three exemplary embodiments.

EXAMPLE 1

Pyrogenic $SiO_2$ with a specific BET surface of 70 m$^2$/g is granulated, dried and sifted after the addition of 12 ppm by weight of nanoscale $Al_2O_3$ powder. Granules ranging in size from 160 µm to 840 µm are purified at a rate of 6 kg/h in a cylindrical rotary oven at 1,200° C. in a gas mixture of $Cl_2$/HCl, with OH groups being removed at the same time. Subsequently, the element content of Li, Na, K, Mg, Ca, Fe, Cu, Cr, Mn, Ti, and Zr is less than 10 ppb by weight for each, or less than the measurable limit. The total content of these impurities is less than 150 ppb by weight. The next step is thermal treatment for the desorption of chlorine groups.

The granulate obtained in this manner has a tamped volume of 1.1 g/cm$^3$ and a BET surface of 15 m$^2$/g.

The granulate is added into a rotating melt form and deposited on its inner wall to create a crucible preform. The preform is heated by an electric arc to about 1500° C. up to a layer thickness of about 8 mm. The individual granules are thereby further compacted into themselves but the fill is not melted overall. The development of a temperature gradient allows desorption of loosely bound gases, especially of hydroxyl groups.

In a next step, the crucible preform prepared in this manner is vitrified zone by zone using an electric arc, in that a vitrification front advances from the inside outward while creating the one transparent region 4 having a radial extension of about 1 mm and a vitrified but opaque outer region 3. Due to the greater temperature effect in the transparent region 4 (higher temperature and longer heating time) this region becomes pore free, or low on pores, in the region of the inner zone (4) to the extent that its density is at least 2.15 g/cm$^3$.

By contrast, the outer region 3 is distinguished by high opacity or low transmissibility in the IR spectrum. This is substantially achieved in that the $SiO_2$ granulate employed is formed from partially porous agglomerates of primary $SiO_2$ particles and has a relatively high specific BET surface (15 m$^2$/g).

The quartz glass crucible produced in this manner is especially distinguished by high purity and high opacity (low transmissibility) in the IR spectrum. The pore size in the opaque outer region is predominantly between 5 and 40 µm.

EXAMPLE 2

A quartz glass crucible is produced as described in Example 1. Thereafter, the transparent region 4 is reinforced by the application of a transparent inner layer 2. The $SiO_2$ granulate used for this purpose has been obtained by the extrusion of a Na silicate (water glass) whose specific BET surface is 700 m$^2$/g and whose tamped volume is 0.45 g/cm$^3$. The size of the granules is between 250 µm and 500 µm. The extrudate is purified by means of hot chlorination at 1200° C. and is thermally compacted. Alkaline remnants are reduced to levels below measurable limits.

The specific BET surface (Brunauer-Emmet-Teller) of the granulate (extrudate) is thereafter 38 m$^2$/g and the tamped volume is 1.11 g/cm$^3$.

In the next step the extrudate is transformed in a second thermal treatment from its amorphous structure into a crystalline structure (cristobalite).

Using this cristobalite, an inner layer 2 is melted on by means of the pour-in process and electric arc smelting to achieve a layer reinforcement of the transparent region 4, increasing the layer thickness to an overall 3 mm.

The inner layer 2 has a homogenous structure and a hydroxyl ion content of 20 ppm by weight. When used as intended, no recrystallization nor pore enlargement are observed.

EXAMPLE 3

A quartz glass crucible is produced as described in Example 1. Thereafter, the transparent region 4 is reinforced by the application of a transparent inner layer 2.

For this purpose, the same $SiO_2$ granulate as used in the production of the quartz glass crucible is vitrified for 1 hour at 1420° C. in hydrogen. Metastable OH groups are removed immediately prior to use of the vitrified granulate by tempering in a vacuum at 10$^{-2}$ mbar and 1000° C. In order to create an inner layer 2, the $SiO_2$ granulate pretreated in this manner is added into the quartz glass crucible by means of the pour-in process and is melted by an electric arc.

A so-called vacuum bake test (1600° C., 4 h, vacuum) revealed neither pore growth nor a tendency toward recrystallization.

Figure 2:
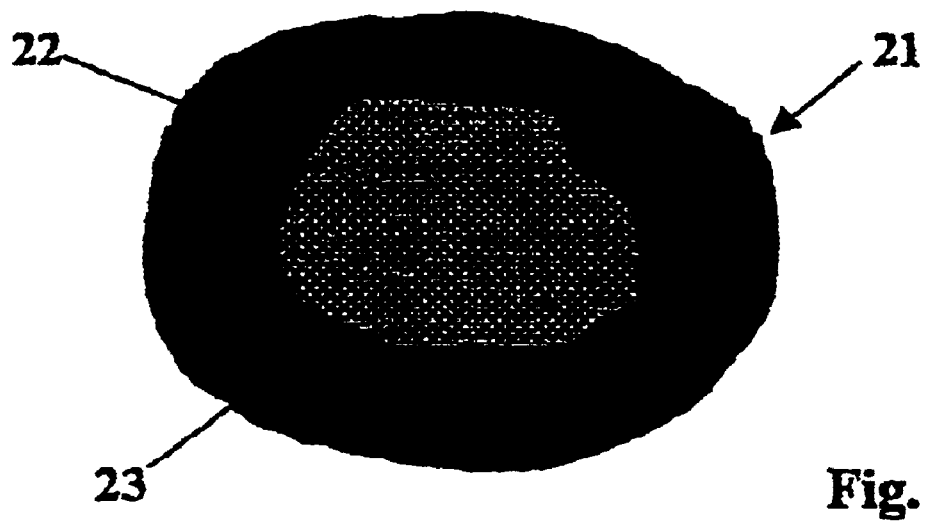

The $SiO_2$ granulate used in the process described above will be described in more detail below by way of FIG. 2. FIG. 2 schematically represents a single preferred granule 21 of the granulate employed. The spherical granule 21 is composed of nanoscale $SiO_2$ particles and has a central region 22 of lesser density, surrounded by an outer region 23 of higher density. The density in the inner region is about 40% of the density of transparent quartz glass while the outer region is about 60% as dense. The boundary surface between the central region 22 and the outer region 23 is fluid. The granule diameter is 420 μm, the thickness of the outer layer 23 is about 100 μm.

The production of the granulate is accomplished by means of the conventional wet granulation process with the use of a mixer. An aqueous suspension is formed from amorphous nanoscale pyrogenic $SiO_2$ particles produced by the flame hydrolysis of $SiCl_4$ and having a specific BET surface of 60 $m^2$/g. Moisture is removed from the aqueous suspension under constant mixing until it breaks up into a grainy mass. After drying, the specific BET surface of the granulate obtained in this manner is about 50 $m^2$/g and the spherical granules have a diameter ranging from 160 μm to 840 μm. The $SiO_2$ granulate is then thermally precompacted by being passed through a chlorine containing atmosphere at about 1200° C. During this step the granulate is also purified, with chlorine purification being particularly effective since the surface of the $SiO_2$ particles is accessible to the purification gas via the pore channels and the gaseous impurities are easily removed. Hydroxyl groups are removed at the same time. The treatment takes place in a rotary quartz glass pipe. The throughput is 10 kgh. During the treatment a temperature gradient develops in the individual granules, which results in the differing densities in the inner region 22 and the outer region 23.

The $SiO_2$ granulate obtained by this pretreatment has a specific BET surface of 25 $m^2$/g and a tamped volume of 1.18 $g/cm^3$. The average granule diameter is about 420 μm. Care is taken to remove smaller particles with a diameter under 90 μm—even though these are not present due to the manufacturing method—before use in the production of opaque quartz glass. Li, Na, K, Mg, Ca, Fe, Cu, Cr, Mn, Ti, and Zr totals less than 200 ppb by weight.

The granulate produced in this manner is composed of amorphous nanoscale $SiO_2$ particles and can be used for the manufacture of the quartz glass crucible according to the invention as described in FIG. 1. Because the individual granules are formed by the agglomeration of a plurality of primary particles of very small particle size, a correspondingly fine and homogenous pore distribution is possible during vitrification as explained in more detail further above.

Figure 3:
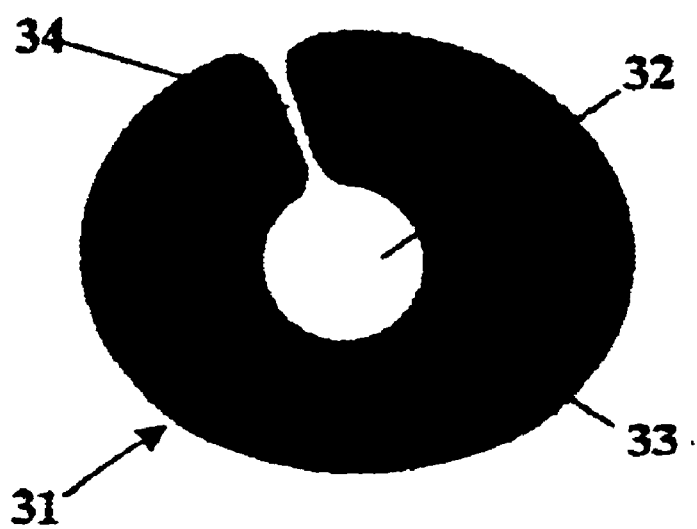

FIG. 3 schematically represents an extrusion granule 31, typical for extrusion granules. The extrusion granule 31 is an agglomerate of primary $SiO_2$ particles. It has a hollow space 32 which is surrounded by an outer layer 33. The outer layer 33 has an intake cone which opens in a narrow channel 34 into the hollow space 32. The outer diameter of the extrusion granule 31 is about 300 μm and the thickness of the outer layer is about 100 μm.

Production of this extrusion granule is described in more detail below.

Highly pure pyrogenic nanoscale $SiO_2$ primary particles with a specific BET surface of 70 $m^2$/g are dispersed in deionized water. 12 ppm by weight of aluminum in form of pyrogenic $Al_2O_3$ is added. The suspension is adjusted to a liter weight of 1380 g/l. The slip viscosity is 450 mPas. Using a conventional extrusion drier (Type D400, manufactured by Dorst) the suspension is extruded at an air temperature of 380° C. and a slip pressure of 10.5 bar. The obtained extrusion granulate has an average granule diameter of 330 μm and a residual moisture of 0.3%. The specific BET surface is 54 $m^2$/g and the fill volume is 0.6 $g/cm^3$. The granulate is then purified and thermally compacted by being passed through a HCl/$Cl_2$ gas mixture at a rate of 6.1 kg/h and a temperature of 1200° C.

The specific BET surface after this treatment is 20 $m^2$/g, the fill volume is 0.8 $g/cm^3$ and the tamped volume is 0.91 $g/cm^3$. The small particle content with a diameter under 90 μm is removed by a cyclone in the course of the processing during the extrusion granulation. The total content of the impurities Li, Na, K, Mg, Ca, Fe, Cu, Cr, Mn, Ti, and Zr totals less than 200 ppb by weight.

The granulate produced in this manner is composed of amorphous, nanoscale $SiO_2$ particles and can also be used for the manufacture of the quartz glass crucible according to the invention as described in FIG. 1. Due to the fact that the individual extrusion granules are formed by the agglomeration of a plurality of primary particles with a very small particle size, a correspondingly fine and homogenous pore distribution is achieved during vitrification. This is further facilitated in that additional nearly enclosed gas volume is created by the hollow space 32 and it remains at least partially intact during vitrification because the trapped gas can only partially escape during vitrification, thus assisting in the formation of the pores and the opacity.

What is claimed is:

1. A quartz glass crucible comprising:
   a crucible body, said crucible body being symmetrical about an axis of rotation and having an outer zone of opaque quartz glass transitioning radially inwardly into an inner zone of transparent quartz glass, said inner zone having a density of at least 2.15 $g/cm^3$;
   the crucible body being made of a synthetic $SiO_2$ granulate with a specific BET surface ranging from 0.5 $m^2$/g to 40 $m^2$/g and a tamped density of at least 0.8 $g/cm^3$, and being formed from at least partially porous agglomerates of primary $SiO_2$ particles.

2. The quartz glass crucible according to claim 1, wherein the specific BET surface of the synthetic $SiO_2$ granulate ranges between 2 $m^2$/g and 20 $m^2$/g and the tamped density of the synthetic $SiO_2$ granulate ranges between 1.0 $g/cm^3$ and 1.4 $g/cm^3$.

3. The quartz glass crucible according to claim 1, wherein in the region of the inner zone the quartz glass has a maximum metastable OH content of 20 ppm by weight.

4. The quartz glass crucible according to claim 1, wherein the quartz glass has a maximum content of firmly-bound hydroxyl groups of 40 ppm weight.

5. The quartz glass crucible according to claim 1, wherein the opaque outer zone and the transparent inner zone are made of the same $SiO_2$ granulate.

6. The quartz glass crucible according to claim 1, wherein the opaque outer zone is made of a first $SiO_2$ granulate of lesser density and the inner zone is made of a second $SiO_2$ granulate of higher density.

7. The quartz glass crucible according to claim 1, wherein the inner zone is made of an $SiO_2$ granulate at least partially comprising synthetic cristobalite.

8. The quartz glass crucible according to claim 1, wherein the inner zone extends up to 2 mm outwardly from an inner surface of the crucible body in the direction of the outer zone.

9. The quartz glass crucible according to claim 1, wherein the inner zone is provided with an inner layer of transparent quartz glass.

10. A process for the production of a quartz glass crucible, said process comprising:
    providing a form rotatable about a rotational axis, said form having an inner wall;
    adding $SiO_2$ granulate into the form to create a granulate layer on the inner wall of the form, and heating the granulate layer from the inner wall outward while rotating the form to create a vitrified crucible body having an opaque outer zone;

the $SiO_2$ granulate being a granulate made from at least partially porous agglomerates of synthetically produced $SiO_2$ primary particles, said granulate having a specific BET surface ranging from 0.5 $m^2/g$ to 40 $m^2/g$ and a tamped density of at least 0.8 $g/cm^3$; and the heating taking place such that a vitrification front advances from the inner wall toward the outer zone while forming an inner zone of transparent quartz glass.

11. The process according to claim 10, wherein the specific BET surface of the $SiO_2$ granulate ranges from 2 $m^2/g$ to 20 $m^2/g$ and the tamped density ranges from 1.0 $g/cm^3$ to 1.4 $g/cm^3$.

12. The process according to claim 10, wherein the $SiO_2$ granulate is in a form of at least partially porous agglomerates of $SiO_2$ primary particles with an average particle size ranging from 0.5 $\mu$m to 5 $\mu$m.

13. The process according to claim 10, wherein the $SiO_2$ granulate is in a form of at least partially porous agglomerates of $SiO_2$ primary particles with an average particle size of less than 0.2 $\mu$m.

14. The process according to claim 10, wherein the granulate is of $SiO_2$ particles with a nonhomogenous density distribution where an inner region of lesser density is at least partially enclosed by an outer region of higher density.

15. The process according to claim 10, wherein the specific surface and the tamped density of the $SiO_2$ granulate is established by a thermal treatment which comprises sintering at a ranging from 800° C. to 1,450° C.

16. The process according to claim 15, wherein the thermal treatment comprises beating in a chlorine-containing atmosphere.

17. The process according to claim 15, wherein the thermal treatment takes place at a temperature between 1,000° C. and 1,300° C. in a nitrogen-containing atmosphere and in the presence of carbon.

18. The process according to claim 10, wherein the $SiO_2$ granulate is doped with between 5 and 20 ppm by weight of aluminum.

19. The process according to claim 10, wherein the $SiO_2$ granulate is of particles having an average particle size ranging from 150 $\mu$m to 800 $\mu$m, and wherein particles having a particle size of less than 90 $\mu$m are avoided.

20. The process according to claim 10, wherein the formation of the outer zone and the inner zone is accomplished through electric arc heating of the granulate layer zone by zone, with the temperature in the inner zone region being greater than 1,900° C.

21. The process according to claim 20, wherein the granulate layer is brought to above 1,000° C. before the heating.

22. The process according to claim 21, wherein the $SiO_2$ granulate is vitrified in the region of the inner zone during the heating.

23. The process according to claim 10, wherein the opaque outer zone is produced from a first $SiO_2$ granulate of lesser density and the transparent inner zone from a second $SiO_2$ granulate of higher density.

24. The process according to claim 23, wherein the second $SiO_2$ granulate is subjected to a dehydration treatment before use, with a maximum OH content of 40 ppm by weight being established at the same time, and wherein We granulate dehydrated in this manner is vitrified.

25. The process according to claim 24, wherein the second $SiO_2$ granulate has a metastable OH content of a maximum 20 ppm. by weight.

26. The process according to claim 10, wherein in the region of the inner zone the $SiO_2$ granulate is at least partially transformed into synthetic cristobalite by tempering.

27. The process according to claim 10, wherein an inner layer of transparent quartz glass is produced on the transparent inner zone by means of pouring $SiO_2$ granulate into the rotating form, deposited on the inner zone and vitrified by means of an electric arc.

28. The process according to the claim 10, wherein a vacuum is created in the region of the inner wall during the heating.

* * * * *